(12) United States Patent
Chua et al.

(10) Patent No.: US 8,120,012 B2
(45) Date of Patent: Feb. 21, 2012

(54) GROUP III NITRIDE WHITE LIGHT EMITTING DIODE

(75) Inventors: Soo-Jin Chua, Crescent (SG); Peng Chen, Nanjing (CN); Zhen Chen, Columbia, SC (US); Eiryo Takasuka, Itami (JP)

(73) Assignees: Agency for Science, Technology and Research, Centros (SG); Sumitomo Electric Industries, Ltd., Osaka-shi, Osaka (JP)

( * ) Notice: Subject to any disclaimer, the term of this patent is extended or adjusted under 35 U.S.C. 154(b) by 42 days.

(21) Appl. No.: 12/442,180

(22) PCT Filed: Sep. 22, 2006

(86) PCT No.: PCT/JP2006/319396
§ 371 (c)(1),
(2), (4) Date: Aug. 4, 2009

(87) PCT Pub. No.: WO2008/035447
PCT Pub. Date: Mar. 27, 2008

(65) Prior Publication Data
US 2009/0302308 A1    Dec. 10, 2009

(51) Int. Cl.
*H01L 29/06* (2006.01)
(52) U.S. Cl. ........ 257/14; 257/13; 257/98; 257/E33.008
(58) Field of Classification Search .............. 257/13, 257/14, 98, E33.008
See application file for complete search history.

(56) References Cited

U.S. PATENT DOCUMENTS

| 2001/0030318 | A1 | 10/2001 | Nakamura et al. |
| 2003/0059971 | A1 | 3/2003 | Chua et al. |
| 2003/0209704 | A1* | 11/2003 | Yamada ............... 257/14 |
| 2004/0023427 | A1* | 2/2004 | Chua et al. .......... 438/47 |
| 2005/0092980 | A1 | 5/2005 | Chen et al. |
| 2006/0043385 | A1 | 3/2006 | Wang et al. |
| 2006/0146563 | A1 | 7/2006 | Chen |

FOREIGN PATENT DOCUMENTS

| CN | 1595670 | 3/2005 |
| GB | 2 361 354 | 10/2001 |
| JP | H10-022525 | 1/1998 |
| JP | H11-243227 | 9/1999 |
| KR | 2000-0074844 | 12/2000 |
| RU | 2 233 013 | 7/2004 |
| RU | 2006130967 | 8/2006 |
| WO | WO 2008/030183 | 3/2008 |

* cited by examiner

*Primary Examiner* — Tan N Tran
(74) *Attorney, Agent, or Firm* — Drinker Biddle & Reath LLP

(57) ABSTRACT

A white-light emitting diode comprises an n-type semiconductor layer, one or more quantum well structures formed over the n-type semiconductor layer, a p-type semiconductor layer formed on the quantum well structure, a first electrode formed on the p-type semiconductor, and a second electrode formed on at least a portion of the n-type semiconductor layer. Each quantum well structure includes an $In_xGa_{1-x}N$ quantum well layer, an $In_yGa_{1-y}N$ barrier layer (x>0.3 or x=0.3), and $In_zGa_{1-z}N$ quantum dots, where $x<y<z\leq 1$.

13 Claims, 5 Drawing Sheets

GROUP III NITRIDE WHITE LIGHT EMITTING DIODE

TECHNICAL FIELD

The invention relates to optoelectronic devices and fabrication methods of the devices, particularly to white light emitting diodes.

BACKGROUND ART

Light emitting diodes (LEDs) are widely used in optical displays, traffic lights, data storage, communications, illuminations and medical applications. Current applications of white LEDs include instrument panels of motor vehicles and liquid crystal display (LCD) backlighting. An important goal for white LEDs is to increase the luminosity level to allow replacement of incandescent lamps, because LEDs are smaller, have higher efficiency, and have about a 50 times longer life span, compared to conventional light bulbs.

Conventional white LEDs are usually fabricated according to two methods. In one method, three separate LED chips are enclosed in a single LED body where a red chip, a blue-green chip and a blue chip combine emissions to yield white light. Another widely used method of producing white LEDs entails using a single high-bright blue or UV GaN-based LED chip that has been coated with fluorescent materials, such as phosphors and organic dyes. The use of the fluorescent material introduces reliability problems and energy losses from the conversion of UV or blue photons to yellow or longer-wavelength photons. Also, the packaging step becomes critical for producing consistency in the color characteristic and quality of the LED.

A conventional approach to producing white light-emitting diodes has been explored by Chen et al. (U.S. Pat. No. 6,163,038). This patent describes a white LED and a method of fabricating the white LED that can radiate white light itself by possessing at least two energy bandgaps in the structure of the LED. However, this technology only uses Multiple Quantum Wells (MQW) to get the white emission. Chen et al. only mentions growing the MQWs emitting light with different colors by adjusting growth parameters, not specifying how to achieve it. Chen et al. fails to produce MQWs emitting light continuously covering all the visible range. That is, Chen et al. merely uses a single LED ship to produce light at plural peaks of the spectrum, which are then combined. Thus, it is necessary to use a specific wavelength of light (e.g., 370-500 nm) to serve as a base.

A related art technology for producing enhanced LEDs has been proposed by Chua et al. (U.S. Pat. No. 6,645,885), which pertains to forming indium nitride (InN) and indium gallium nitride (InGaN) quantum dots grown by metal-organic vapor phase epitaxy. This patent describes indium nitride (InN) and indium-rich indium gallium nitride (InGaN) quantum dots embedded in single and multiple InxGa1-xN/InyGa1-yN quantum wells (QWs) formed by using at least one of trimethylindium (TMIn) triethylindium (TEIn) and ethyldimethylindium (EDMIn) as an antisurfactant during MOCVD growth, and the photoluminescence wavelength from these dots ranges from 480 nm to 530 nm. Controlled amounts of TMIn and/or other Indium precursors are important in triggering the formation of dislocation-free quantum dots (QDs), as are the subsequent flows of ammonia and TMIn. This method can be used for the growth of the active layers of blue and green light emitting diodes (LEDs). However, this technology fails to produce a diode that generates white light. White light requires a range of 400 to 750 nm. However, the technology of Chua et al. only covered the lesser wavelength range of 480 nm to 530 nm and could not be used to generate white light.

Accordingly, modern semiconductor and display technology requires new white light-emitting diodes that are easy to construct, have high luminosity and color rendering properties, and have the necessary reliability to establish applications such as light sources for illumination and liquid crystal display devices.

DISCLOSURE OF INVENTION

Accordingly, the invention is aimed to producing a white light-emitting diode (LED) that substantially obviates one or more problems due to limitations and disadvantages of the related art.

An object of the invention is to provide an LED that incorporates all visible emissions into one chip.

According to one aspect of the present invention, a white-light emitting diode comprises an n-type semiconductor layer, one or more quantum well structures, a p-type semiconductor layer, a first electrode; and a second electrode. Each quantum well structure comprises an $In_xGa_{1-x}N$ quantum well layer and an $In_yGa_{1-y}N$ barrier layer, where x>0.3 or x=0.3, and x>y, and encompasses $In_zGa_{1-z}N$ quantum dots where x<z≦1. The quantum well structures are formed over the n-type semiconductor layer. The p-type semiconductor layer is formed over the quantum well structures. The first electrode is formed over the p-type semiconductor. The second electrode is formed over at least a portion of a surface of the n-type semiconductor layer.

According to another aspect of the present invention, a white-light emitting diode comprises an n-type semiconductor layer, one or more quantum well structures, a p-type semiconductor layer, a first electrode and a second electrode. Each quantum well structure comprises an $In_xGa_{1-x}N$ quantum well layer and an $In_yGa_{1-y}N$ barrier layer, where x>y, and encompasses $In_zGa_{1-z}N$ quantum dots, where x<z≦1. The well layer $In_xGa_{1-x}N$ contains p-type dopant. The quantum well structures are formed over the n-type semiconductor layer. The p-type semiconductor layer is formed over the quantum well structures. The first electrode is formed over the p-type semiconductor. The second electrode is formed over at least a portion of a surface of the n-type semiconductor layer.

In the diode according to the above aspects, the $In_xGa_{1-x}N$ quantum well layer contains p-type dopant and n-type dopant, and x>0.3 or x=0.3. Each quantum well structure has a continuous emission spectrum ranging from 420 nm to 750 nm. The quantum dots are formed by first flowing at least one of TMIn, TEIn or EDMIn at a first flow rate and a first time to form nuclei, and then flowing at least one of TMIn, TEIn or EDMIn with TMG and ammonia at a second flow rate to make the nuclei grow and be capped in the quantum well layer. The number of the quantum well structures is between about 1 to 30. A thickness of the $In_xGa_{1-x}N$ quantum well layer is about 1 to 10 nm and a thickness of the $In_yGa_{1-y}N$ quantum barrier layer is about 5 to 30 nm. The relationship, 1>x>y>0 or y=0, can be satisfied. The n-type semiconductor layer is formed on a substrate and the substrate is made of one of sapphire, SiC, GaN and ZnO. At least one of biscyclopentadienyl magnesium ($Cp_2Mg$), diethyl zinc (DEZn) and silane is used as dopants. A light emitting diode emits light in a range of about 400 nm to 750 nm. InN molar fraction of well layer x is important for the emission range extension to the longer wavelength. With higher x in $In_xGa_{1-x}N$ quantum well layer, emission wavelength extends to longer wavelength. When x is equal to or more than 0.3, range of the emission spectrum from the MQW structure extends to 600 nm or longer. Incorporation of Zn or Zn and Si into the $In_xGa_{1-x}N$ quantum well layer is important for the increase of the emission power from the MQW structure, especially for longer wavelength range.

According to still another aspect of the present invention, a quantum well structure that emits white light. The quantum well structure comprises: an $In_xGa_{1-x}N$ quantum well layer; indium-rich InGaN quantum dots embedded in the $In_xGa_{1-x}N$ quantum well layer, where x>0.3 or x=0.3; and an $In_yGa_{1-y}N$ quantum barrier layer over the quantum dots and the quantum well layer.

According to still another aspect of the present invention, a quantum well structure that emits white light. The quantum well structure comprises an $In_xGa_{1-x}N$ quantum well layer, indium-rich InGaN quantum dots embedded in the $In_xGa_{1-x}N$ quantum well layer, and an $In_yGa_{1-y}N$ quantum barrier layer over the quantum dots and the quantum well layer. The indium-rich InGaN quantum dots are doped with p-type dopant In the above aspects, the InGaN quantum well layer is doped with p-type dopant. The InGaN quantum well layer is doped with p-type dopant and n-type dopant. The quantum well structure is provided to emit light continuously ranging from 420 nm to 750 nm. The quantum dots are formed by first flowing at least one of TMIn, TEIn or EDMIn at a first flow rate and a first time to form nuclei, and then flowing at least one of TMIn, TEIn or EDMIn with TMG and ammonia at a second flow rate to make the nuclei grow and be capped in the quantum wells. A thickness of the $In_xGa_{1-x}N$ quantum well layer is about 1 to 10 nm and a thickness of the $In_yGa_{1-y}N$ quantum barrier layer is about 5 to 30 nm.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

It is to be understood that both the foregoing general description and the following detailed description of the invention are exemplary and explanatory and are intended to provide further explanation of the invention as claimed.

BRIEF DESCRIPTION OF DRAWINGS

The accompanying drawings, which are included to provide a further understanding of the invention and are incorporated in and constitute a part of this application, illustrate embodiments of the invention and together with the description serve to explain the principle of the invention.

In the drawings.

BEST MODE CARRYING OUT THE INVENTION

Reference will now be made in detail to the preferred embodiments of the invention, examples of which are illustrated in the accompanying drawings.

The invention fabricates a diode using epitaxial techniques. The inventive diode utilizes quantum dots (QDs) to produce electroluminescence from the PN junction having a broad continuous peak ranging at least from 420 nm to 750 nm.

QDs can be defined as a particle of matter so small that the addition or removal of an electron changes its properties in some useful way. Alternately, quantum dots can be viewed as very small devices, i.e., cage, that confine a small number, as few as one, of free electrons. QDs typically have dimensions on the order of nanometers. That is, quantum dots can have a size range from 1 nm to 200 nm. In many applications, the typical size ranges from 20 nm to 80 mm.

Using epitaxial growth processes, quantum dots can be grown with confinement, in many cases, in all three dimensions in the surrounding material. In lithographically defined QDs, a quantum well provides a confining potential along the growth direction while an electrostatically induced potential barrier provides the lateral confinement.

The epitaxial growth of thin films or QDs of nitrides or oxides can be accomplished using metalorganic chemical vapor deposition (MOCVD). MOCVD uses a carrier gas flow containing a dilute mixture of metal organic precursors. The gas mixture flows into a reactor chamber at pressure ranging from 50 Torr to 750 Torr where substrate temperatures range from 500° C. to 1200° C. for conventional Group III-V nitride materials. Ammonia ($NH_3$) can be used as the nitrogen source for a formation of nitrides layers such as GaN, InGaN or InN. The reactive gases decompose and deposit thin epitaxial layers of III-V nitride materials (e.g., GaN, AlGaN, InGaN, etc.) from a few nano-meters to a few micro-meters thick, as required.

Figure 1:
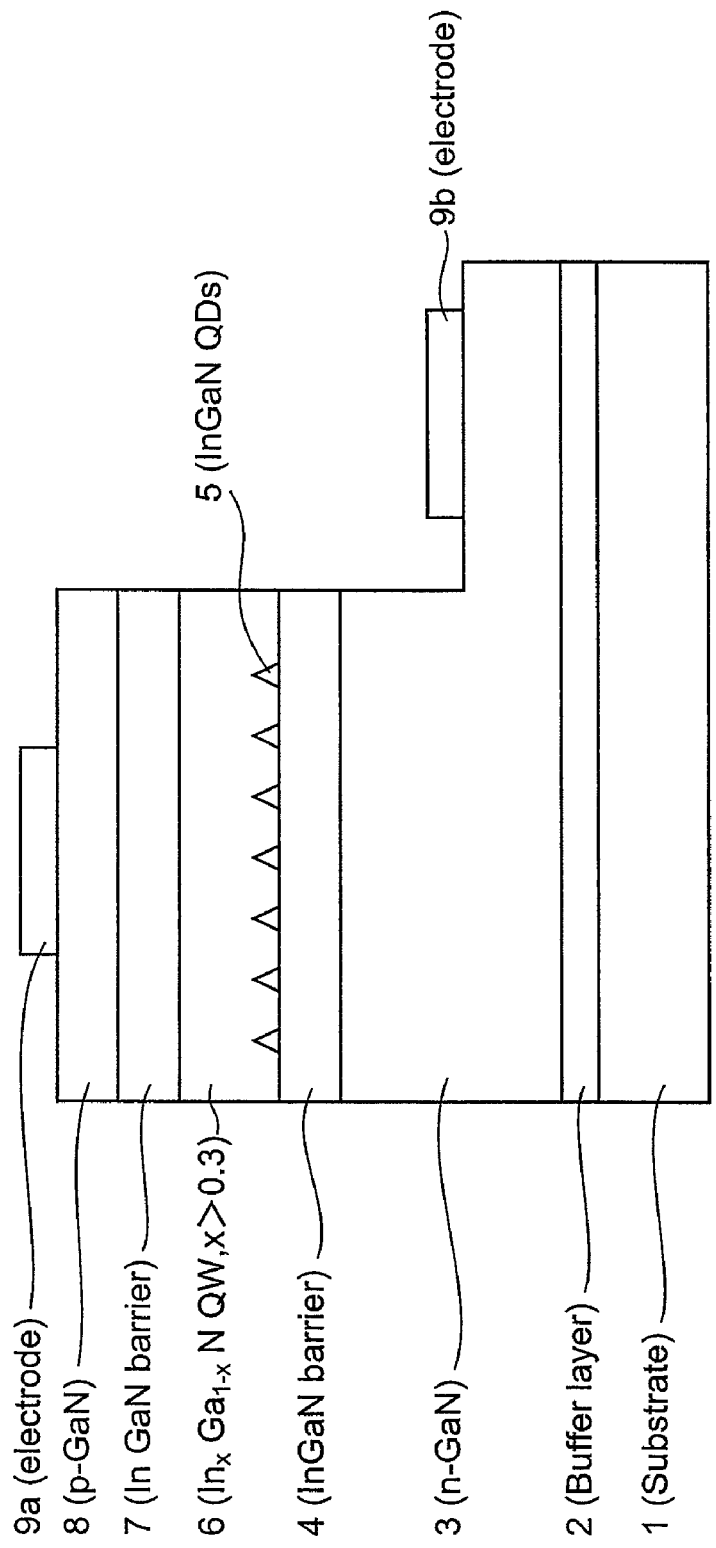
FIG. 1 shows a diagram of a white LED having QDs capped by an $In_xGa_{1-x}N$ well layer, where x>0.3 or x=0.3, at the active layer in accordance with the invention.

FIG. 1 is a diagram showing a white light emitting diode in accordance with the invention.

FIG. 1 shows a substrate 1 which can be sapphire, silicon carbide (SiC), zinc oxide (ZnO), free-standing GaN or other substrates. Buffer layer 2 is the GaN buffer layer grown at low temperature, around 600° C. An n-type GaN layer 3 is grown at high temperature, around 1000° C. Layer 3 can be doped with Si to get good n-type conduction. When substrate 1 is free-standing GaN, buffer layer 2 is not needed. Layer 4 is a GaN or InGaN barrier layer. After the barrier layer 4 is grown, indium precursor such as TMIn is flowed to form a "seed" for the formation of indium rich QDs 5. This process is referred to as indium burst. Layer 6 is an $In_xGa_{1-x}N$ quantum well layer having high indium mole fraction, where x>0.3 or x=0.3. Another GaN or InGaN barrier layer 7 is grown over the layer 6. Layer 6 can be doped with p-type dopant such as Zn to get higher emission at long wavelength range. To get further higher emission, Layer 6 can be doped with both p-type dopant and n-type dopant. P-type dopant can be Zn, and n-type dopant can be Si. Layer 8 is p-type GaN layer grown at around 1000° C. doped with Mg. Layer 8 can be p-type InGaN layer grown at a temperature range from 650° C. to 850° C. This low-temperature grown p-InGaN layer is preferable in case the emission intensity from the MQW structure is sensitive to the thermal history after formation of the MQW structure. The first electrode 9a is formed on the top of the layer 8. A second electrode 9b is formed over the layer 3.

In FIG. 1, p-type layer 8 and n-type layer 3 can be switched, with electrode 9a and 9b being switched.

The relatively rough surface of the low temperature (LT) GaN or InGaN barrier layer (layer 4 in FIG. 1) could help keep the impinging indium atoms, which come from the cracking (decomposition) of the TMIn precursor, stay longer on the surface, thereby increasing the indium incorporation, which will also result in the red shift in the emission.

Although trimethyl indium (TMIn) is frequently used as the precursor, other indium organometallic compounds can be used, such as triethylindium (TEIn) and ethyldimethylindium (EDMIn). These organometallic compounds can be used singly or in mixtures.

In the invention, indium rich QDs are formed and capped in $In_xGa_{1-x}N/GaN$ or $In_xGa_{1-x}N/In_yGa_{1-y}N$ single or multiple quantum wells, which normally emit long wavelength light (yellow and red). The QDs are induced by flowing TMIn (trimethyl indium) or other indium precursors acting as nuclei. The white emission can be obtained by varying the wavelength and the intensity of the emission distribution. This can be achieved by adjusting the condition of QD induction step, such as temperature, reactor pressure, TMIn partial pressure and duration of TMIn flow during the indium burst. This also can be achieved by adjusting the epitaxial growth parameters of the well layer, such as temperature, reactor pressure, $NH_3$ partial pressure, the partial pressure of In organometallic precursor(s) (TMIn, TEIn or EDMIn) and duration of the InGaN quantum well growth. By varying the parameters, QDs of varying indium content and size can be formed.

Two considerations are of interest when forming Indium rich QDs. First, the amount of TMIn acting as nucleus and the duration of the TMIn flow are important. Too much flow will create indium droplets, which compete with the formation of Indium rich QDs. The quantum confinement effect of the QDs is the reason why QDs have very high luminescence efficiency at room temperature. Second, the subsequent flows of TMIn, TMGa and ammonia are also very important for the formation of QDs and the quantum well with the QDs capped in it. Usually, the quantum well growth should be conducted with a high partial pressure of ammonia.

Figure 3:
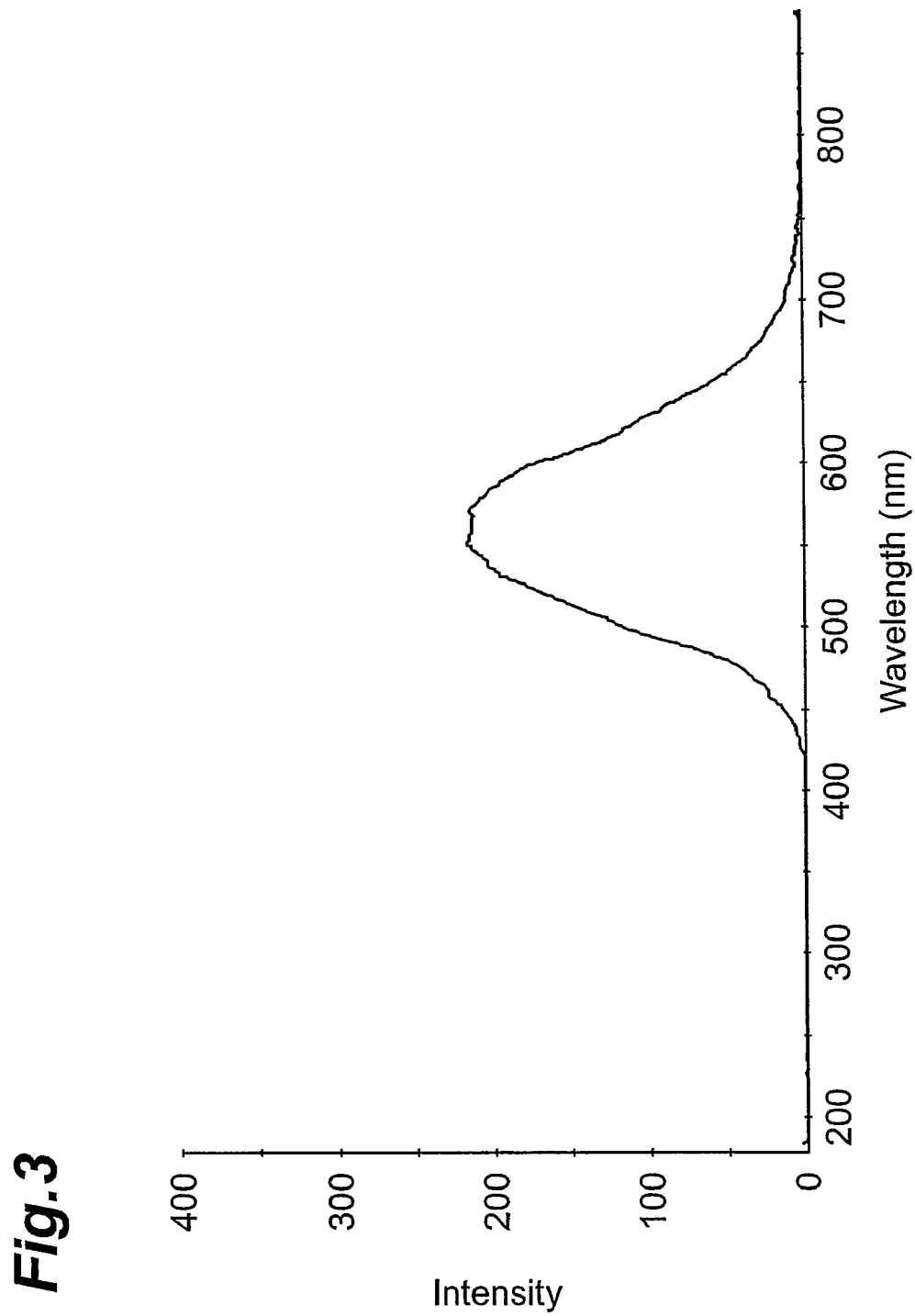
FIG. 3 shows the room temperature electroluminescence spectrum of a white LED in accordance with the invention.

Partial pressure of In organometallic precursor(s) such as TMIn for the growth of the quantum well, with which the In-rich QDs are capped, is important for the control of emission. Higher partial pressure of TMIn during the growth of the quantum well makes higher emission power from the quantum well structure with the QDs. In composition x of the well layer can be measured by XRD (X-Ray Diffraction), SIMS (Secondary Ion Mass Spectrometry) or Electron Energy Loss Spectrometry (EELS). When the QDs are capped with the quantum well grown at such TMIn partial pressure that makes In composition x of $In_xGa_{1-x}N$ quantum well equal to 0.3 or more than 0.3, the emission at longer wave length is dramatically enhanced especially in the range from 500 nm to 750 nm. Higher TMIn partial pressure during the capping of the QDs makes higher resultant In composition of the QDs. FIG. 3 shows electroluminescence spectrum from the white LED schematically illustrated in FIG. 1. In this case, three periods of multiple quantum well (MQW) structure was employed for the active layer. The partial pressure of TMIn and TMGa is 1.9 Pa and 1.1 Pa, respectively, during the growth of quantum wells. The EL spectrum continuously covers a wide range from 420 nm to 750 nm. Another growth condition with TMIn partial pressure of 1.1 Pa and TMGa partial pressure of 1.1 Pa during the growth of quantum wells was also tried. In this case, the spectrum ranges from 450 nm to 580 nm. Higher TMIn partial pressure during the quantum well growth is effective for the emission enhancement of longer wavelength.

Figure 2:
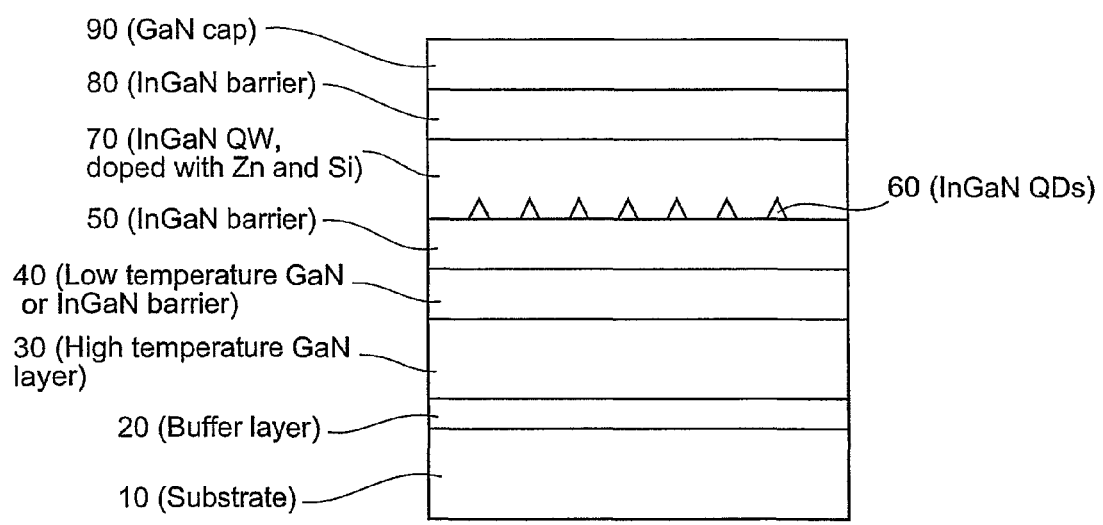
FIG. 2 shows a diagram of quantum well (QW) structure having QD capped by the well layer doped with Zn and Si, in accordance with the invention.

FIG. 2 shows another preferred embodiment of the invention. The diagram shows schematic structure around a quantum well layer. To complete LED, at least electrodes will be needed, in accordance with the structure illustrated in FIG. 1.

In FIG. 2, layer 10 is a substrate, which is preferably sapphire, SiC, free-standing GaN or ZnO. Layer 20 is a buffer grown at low temperature, typically ranging from 450° C. to 600° C. Layer 30 is an n-type GaN layer, grown at around 1030° C. Typical dopant of layer 30 is Si. Layer 40 is a GaN or InGaN layer. Layer 50 is an $In_yGa_{1-y}N$ barrier layer, wherein y preferably ranges from 0.01 to 0.1 grown at about 700° C. to 800° C. After the growth of layer 5, indium rich QDs 60 are formed using indium precursor frow before well layer growth. Over the QDs is formed layer 70, the $In_xGa_{1-x}N$ quantum well where x is greater than y, and preferably greater than 0.3. Layer 70 is Zn-doped for the enhancement of long wavelength emission. Layer 80 is another $In_yGa_{1-y}N$ barrier typically similar to layer 50. Layer 90 is a p-GaN or p-InGaN cap grown at temperatures in the range of between 700° C. and 1100° C.

In FIG. 2, substrate 10 may be any material suitable for the growth of GaN, such as sapphire, SiC, free-standing GaN, ZnO, and other alternatives with thickness of about 200 μm (micro-meter) to 500 μm. Layer 20, the low temperature buffer which is about 20 nm to 100 nm thick, can also be a multi-layered AlGaN/GaN buffer layer. Layer 30 can be un-doped GaN, Si-doped GaN, or Mg-doped GaN. Si concentration of the layer ranges from $2\times10^{17}$ cm$^{-3}$ to $9\times10^{18}$ cm$^{-3}$. The Mg concentration ranges from $5\times10^{17}$ cm$^{-3}$ to $3\times10^{20}$ cm$^{-3}$. Its thickness ranges from 1 μm to 10 μm. Layer 40 can be GaN, InGaN or AlGaN with a thickness of about 5 nm to 30 nm. Layers 50 and 80 can be GaN instead of InGaN. Layer 90, the 10 nm to 1000 nm thick cap, can also be AlGaN.

Figure 4:
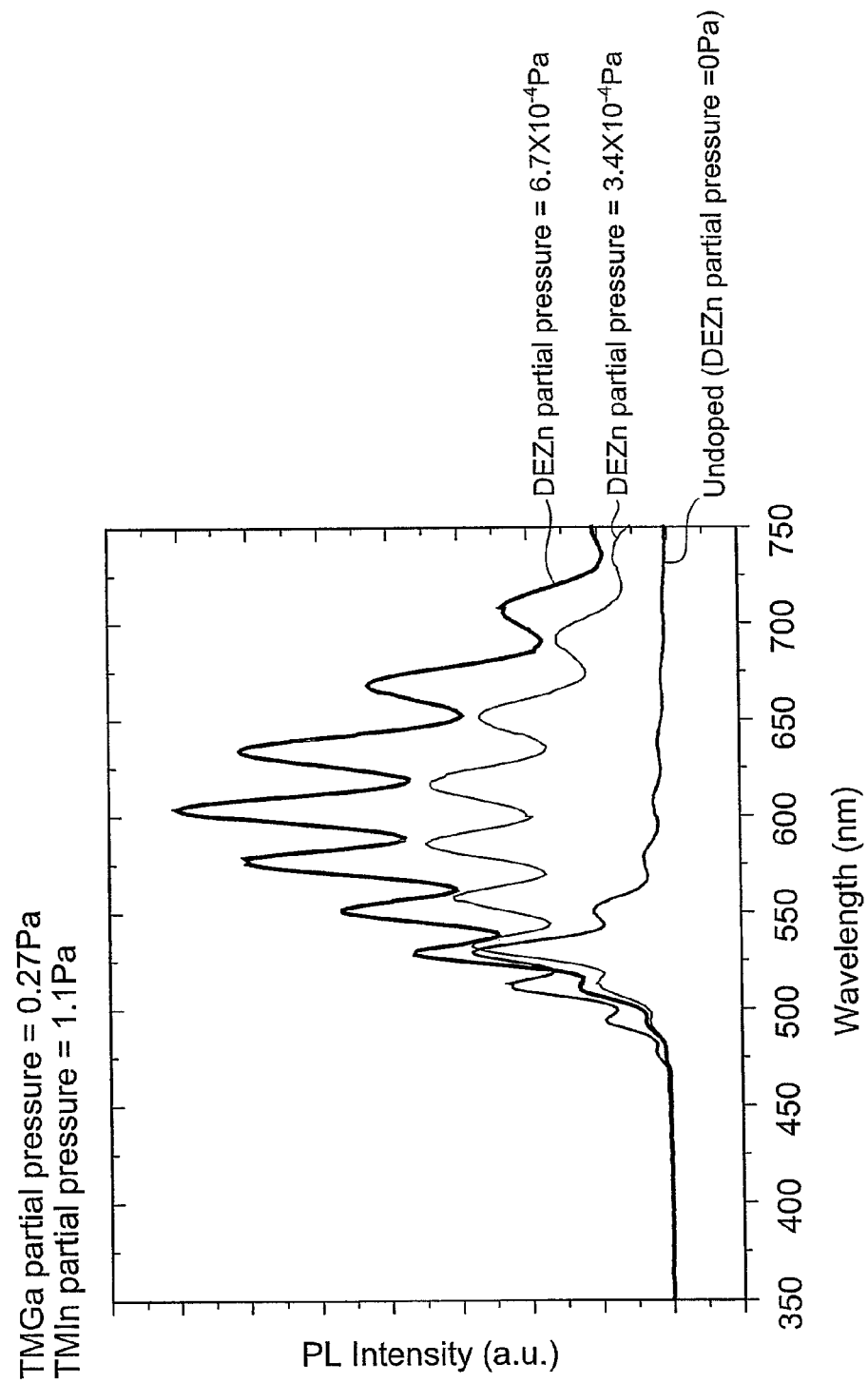
FIG. 4 shows the room temperature photoluminescence spectrum of a multi-quantum well structure, with well layer doped with Zn, in accordance with the invention.

Doping of Zn to layer 70 is important to extend the luminescence range. FIG. 4 shows photoluminescence spectra from MQW structures illustrated in FIG. 2 with different partial pressure of DEZn during the growth of quantum well layers. In this case, the emission layer consists of four periods of MQW and for all well layer growth, partial pressure of TMGa and TMIn was kept 0.27 Pa and 1.1 Pa, respectively. Higher DEZn partial pressure results in higher doping concentration of Zn in the quantum well, and consequently, higher emission in the range from 550 nm to 750 nm.

Figure 5:
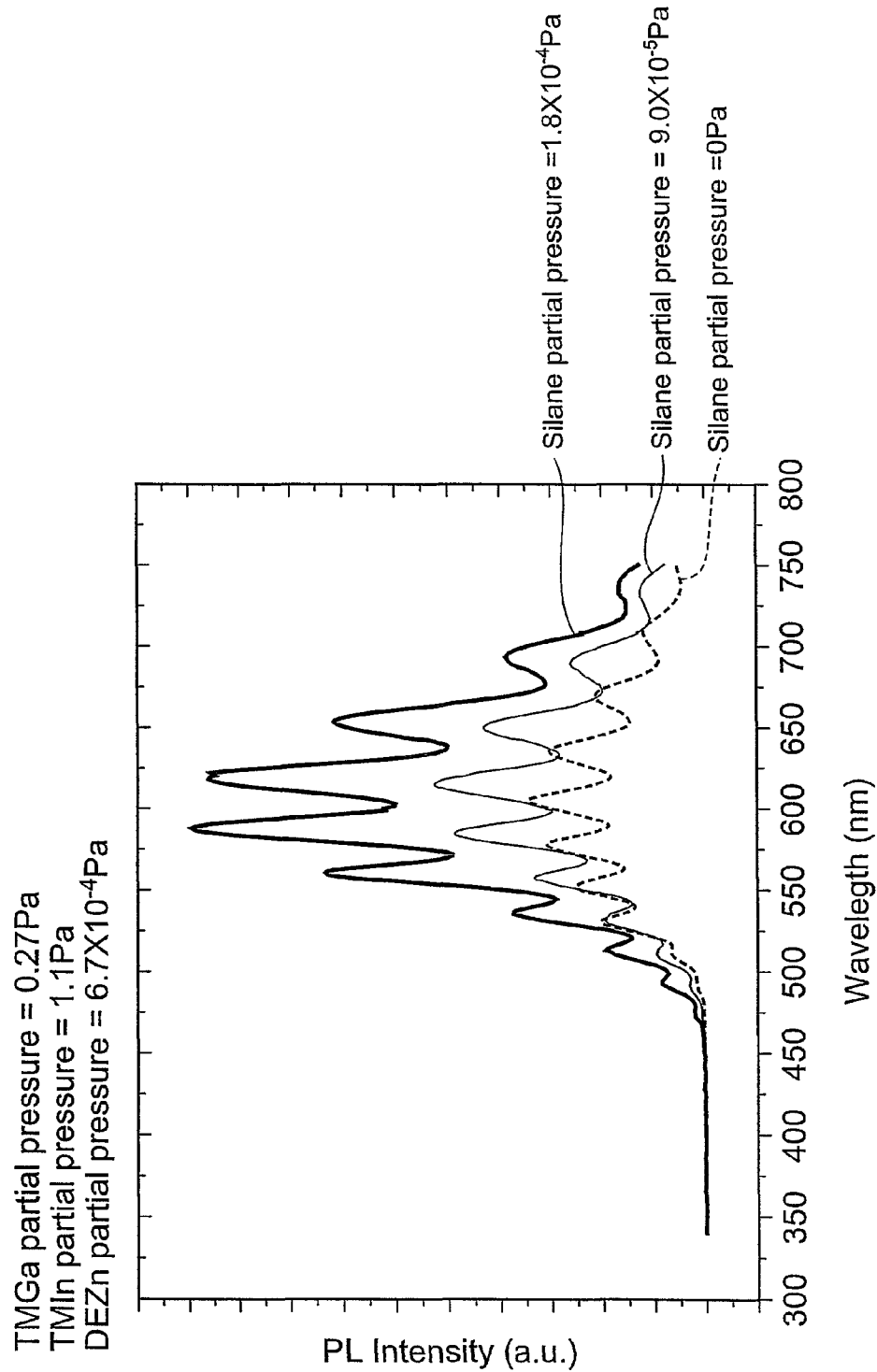
FIG. 5 shows the room temperature photoluminescence spectrum of a multi-quantum structure, with well layer doped with Zn and Si, in accordance with the invention.

Simultaneous doping of Zn and Si to layer 70 is effective for the enhancement of emission. FIG. 5 shows photoluminescence spectra from MQW structures illustrated in FIG. 2 with different partial pressure of silane. In this case, the emission layer consists of four periods of MQW and for all well layer growth partial pressure of TMGa, TMIn and DEZn was kept 0.27 Pa, 1.1 Pa and $6.7\times10^{-4}$ Pa, respectively. Higher silane partial pressure results in higher doping of Si in the quantum well, and consequently higher emission power.

The insertion of the layer 40 in FIG. 2 is important to extend the luminescence range. Without being bound by any theory of the invention, it is thought that the low temperature GaN layer (layer 40 in FIG. 2) partially relaxes the compressive strain between the InGaN well and barrier. This relaxation of compressive strain can result in a phase shift in the luminescence. Relaxation of the compressive strain can also enhance the InGaN phase separation according to Kaprov's (MRS Internet J Nitride Semicond. Res. 3, 16 (1998)) theory, in which compressive strain can suppress the InGaN phase separation.

The relatively rough surface of the low-temperature (LT) GaN layer (layer 40 in FIG. 2) could help keep the impinging indium atoms, which come from the cracking of TMIn precursor, on the surface for a longer time, thereby increasing the indium incorporation which will also result in phase shifting of the luminescence.

A method for growing a white light-emitting LED according to a preferred embodiment of the invention will be described below.

First, a low temperature buffer and then a high temperature n-type GaN layer are grown over a sapphire substrate, with the latter performed usually at about 1000° C. The temperature is next lowered to about 700° C. to 800° C. to grow the GaN or InGaN barrier layer. A low temperature grown buffer is needed when they are grown on a sapphire substrate.

After the growth of the barrier layer, an appropriate amount of TMIn or other indium organometallic precursor(s) is flowed into the reaction chamber in the presence of ammonia. Indium atoms from TMIn aggregate at the atomic surface of the InGaN barriers to form the "seeds" for the subsequent growth of QDs.

In a preferred embodiment of the invention, one white LED was grown by MOCVD on (0001) sapphire substrates. MOCVD was performed using trimethyl gallium (TMG), trimethyl indium (TMIn) and ammonia ($NH_3$) as precursors. For this white LED, a 2 μm thick undoped bulk GaN was first grown on the 25 nm thick GaN buffer layer. The growth temperatures are from 500° C. to 560° C. and from 1000° C. to 1100° C., respectively, for the GaN buffer layer and high temperature GaN layer. After the growth of the GaN layer, the growth temperature was lowered down to about 700° C. (ranging from 650° C. to 750° C.) for the deposition of a GaN or InGaN barrier and an InGaN well. The indium composition in the InGaN barrier is less than that in the well. After the growth of the GaN or InGaN barrier, and prior to the growth of high indium content well, TMIn was flowed for a short time, varying from 2 to 5 seconds with the TMGa flow switched off. This process is referred to as indium burst. Such a burst will create seeds for the growth of InGaN QDs with varying sizes and indium compositions. The burst duration can be varied for forming the seeds in each layer. The well thickness was about 3 nm. The growth of GaN barrier, the indium burst and the InGaN well were repeated four times.

The indium burst can be performed for any appropriate time varying from 0.5 seconds to 1 minute or more. However, 2 to 5 seconds are preferred for the indium burst time. A preferable flow rate of the organometallic indium compound is less than 100 umol/min (micro-mol/min) during the indium burst. The well thickness can be about 0.5-10 nm, preferably 2-4 nm and most preferably about 3 nm.

Then, a high temperature Mg doped GaN layer was grown on the top of the four periods of $In_xGa_{1-x}N$/GaN MQW. The carrier gas was $H_2$ and $N_2$ respectively for the growth of GaN and InGaN. Finally, a first electrode is formed on the p type semiconductor, and a second electrode is formed on a section of the Si-doped GaN layer.

Different organometallic materials can be used for doping different structures of the invention. Biscyclopentaldienyl magnesium ($CP_2Mg$) can be used to produce Mg-doped GaN in, for example, layer 3 or layer 8 in FIG. 1. Diethyl zinc (DEZn) can also be used to provide, for example, the p-doping in layer 8. Silane can also be used as a dopant, for example, to form Si-doped GaN in layer 3.

The example of the preferred embodiment used four quantum well structures. However, any appropriate number of quantum well structures can be used. Practically, 1 to 60 quantum well structures can be used. Preferably 1 to 30 quantum well structures are used.

In the invention, the thickness of the $In_xGa_{1-x}N$ quantum well layer is in the range of 0.5 to 20 nm and is preferably 1 to 10 nm. The thickness of the $In_yGa_{1-y}N$ barrier layer can be in the range of 2 to 60 nm and is preferably 5 to 30 nm. In a preferred embodiment of the invention, the $In_xGa_{1-x}N$ quantum well layer has a larger composition than the $In_yGa_{1-y}N$ barrier layer such that $1>x>y>0$ or $y=0$. The composition of the $In_xGa_{1-x}N$ quantum well layer is also preferably more than 0.3 ($x>0.3$). The $In_xGa_{1-x}N$ quantum well layer is preferably Zn-doped. Simultaneous Si-doping in the $In_xGa_{1-x}N$ quantum well layer is more preferable.

FIG. 3 shows the electroluminescence spectrum of a white LED formed according to a preferred embodiment of the invention. FIG. 3 shows a wavelength range of emission that is from 420 nm to 750 nm, which covers the primary colors of blue, green and red. As a result, the diode produces white light.

That is, the inventive diode can radiate white light ranging from about 420 nm to 750 nm by adjusting the indium burst parameters such as the amount of In precursors, the burst duration and the temperature. Higher In composition of the quantum well and Zn- and Si-doping in the layer dramatically enhances the emission especially in red color spectrum range. Control of In composition, Zn concentration and Si concentration in the well layer can be done by adjusting the partial pressure of In precursor (such as TMIn), Zn precursor (such as DEZn) and Si precursor (such as silane), respectively. Combination of these growth parameter adjustments enables wide range color index control of the emission as well as power control of the emission. The white LED radiates white light by itself and does not require the combination of separate LEDs or, alternately, the utilization of a white light-emitting fluorescent material. The inventive LED is thus cheaper, more convenient to fabricate, more stable and has a longer lifetime.

As a result, the invention offers clear advantages over the conventional art emitting devices, which have single emitting centers so that white light can only be obtained by combining several devices or by color conversion using a phosphor. In contrast, the invention utilizes QDs of different sizes to yield different color lights that combine on a single chip to yield white light. The invention therefore offers compactness, efficiency, luminosity and low cost.

It will be apparent to those skilled in the art that various modifications and variations can be made in the liquid crystal display device using dual light units of the invention without departing from the spirit or scope of the invention. Thus, it is intended that the invention covers the modifications and variations of this invention provided they come within the scope of the appended claims and their equivalents.

The invention claimed is:

1. A quantum well structure that emits white light, which comprises:
   an $In_xGa_{1-x}N$ quantum well layer doped with p-type dopant;
   indium-rich InGaN quantum dots embedded in the $In_xGa_{1-x}N$ quantum well layer; and
   an $In_yGa_{1-y}N$ quantum barrier layer over the quantum dots and the quantum well layer,
   wherein the InGaN quantum well layer contains n-type dopant.

2. The quantum well structure of claim 1, wherein the InGaN quantum well layer contains p-type dopant.

3. The quantum well structure of claim 1, wherein the InGaN quantum well layer contains both p-type dopant and n-type dopant.

4. The quantum well structure of claim 1, wherein the quantum well structure is provided to emit light ranging from 420 nm to 750 nm and the light has a continuous emission spectrum ranging from 420 nm to 750 nm.

5. The quantum well structure of claim 1, wherein the quantum dots are formed by first flowing at least one of TMIn, TEIn or EDMIn at a first flow rate and a first time to form nuclei, and then flowing at least one of TMIn, TEIn or EDMIn with TMG and ammonia at a second flow rate to make the nuclei grow and be capped in the quantum wells.

6. The quantum well structure of claim 1, wherein a thickness of the $In_xGa_{1-x}N$ quantum well layer is about 1 to 10 nm and a thickness of the $In_yGa_{1-y}N$ quantum barrier layer is about 5 to 30 nm.

7. The quantum well structure of claim 1, wherein $1>x>y>0$ or $y=0$.

8. The quantum well structure of claim 1, wherein at least one of biscyclopentadienyl magnesium, diethyl zinc and silane is used as dopants during the growth of the quantum well layer.

9. The quantum well structure of claim 1, wherein the quantum well structure is provided to emit light ranging from 420 nm to 750 nm and the light has a continuous emission spectrum ranging from 420 nm to 750 nm.

10. The quantum well structure of claim 1, wherein the quantum dots are formed by first flowing at least one of TMIn, TEIn or EDMIn at a first flow rate and a first time to form nuclei, and then flowing at least one of TMIn, TEIn or EDMIn with TMG and ammonia at a second flow rate to make the nuclei grow and be capped in the quantum wells.

11. The quantum well structure of claim 1, wherein a thickness of the $In_xGa_{1-x}N$ quantum well layer is about 1 to 10 nm and a thickness of the $In_yGa_{1-y}N$ quantum barrier layer is about 5 to 30 nm.

12. The quantum well structure of claim 1, wherein $1>x>y>0$ or $y=0$.

13. The quantum well structure of claim 1, wherein at least one of biscyclopentadienyl magnesium, diethyl zinc and silane is used as dopants during the growth of the quantum well layer.

* * * * *